United States Patent
Motomura et al.

(10) Patent No.: US 6,705,003 B2
(45) Date of Patent: Mar. 16, 2004

(54) PRINTED WIRING BOARD WITH PLURALITY OF INTERCONNECT PATTERNS AND CONDUCTOR BUMPS

(75) Inventors: Tomohisa Motomura, Fuchu (JP); Yoshitaka Fukuoka, Hachioji (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/884,917

(22) Filed: Jun. 21, 2001

(65) Prior Publication Data

US 2002/0000328 A1 Jan. 3, 2002

(30) Foreign Application Priority Data

Jun. 22, 2000 (JP) ...................... P2000-187956

(51) Int. Cl.$^7$ ................................. H05K 3/36
(52) U.S. Cl. ........................ 29/830; 29/829; 29/831; 29/844; 174/255; 174/265; 156/295; 156/298; 438/115; 438/622
(58) Field of Search ............................ 29/830, 846, 852, 29/840, 848, 825, 844, 748, 739; 174/255, 262, 264, 265, 829, 831, 841, 834; 438/622, 623, 127; 156/295, 298, 330, 303.1

(56) References Cited

U.S. PATENT DOCUMENTS

| | | | |
|---|---|---|---|
| 3,720,808 A | 3/1973 | Morrissey | 219/469 |
| 3,835,531 A | 9/1974 | Luttmer | 29/625 |
| 3,930,913 A | * 1/1976 | Jacob | 96/36.2 |
| 4,012,307 A | * 3/1977 | Phillips | 156/644 |
| 4,079,509 A | 3/1978 | Jackson et al. | 29/589 |
| 4,243,869 A | 1/1981 | Scribner | 219/216 |
| 4,463,673 A | 8/1984 | Moore | 101/129 |
| 4,536,239 A | 8/1985 | Benson | 156/64 |
| 4,915,983 A | * 4/1990 | Lake et al. | 427/98 |
| 5,046,238 A | 9/1991 | Daigle et al. | 29/830 |

(List continued on next page.)

FOREIGN PATENT DOCUMENTS

| | | | |
|---|---|---|---|
| JP | 1-169981 | * 7/1989 | ............ 29/599 |
| JP | 01-224184 | 9/1989 | |
| JP | 3-091993 | 4/1991 | |
| JP | 4-062993 | 2/1992 | |
| JP | 4-267586 | 9/1992 | |
| JP | 4-352385 | 12/1992 | |
| JP | 5-067696 | 3/1993 | |
| JP | 5-198946 | 8/1993 | |
| JP | 5-299878 | 11/1993 | |
| JP | 6-283866 | 10/1994 | |

(List continued on next page.)

OTHER PUBLICATIONS

Kenji Sasaoka et al., U.S. Ser. No. 09/093,605, "Apparatus for Manufacturing a Wiring Board and Method for Manufacturing a Wiring Board", filed Jun. 9, 1998.

(List continued on next page.)

*Primary Examiner*—Carl J. Arbes
*Assistant Examiner*—Minh Trinh
(74) *Attorney, Agent, or Firm*—Finnegan, Henderson, Farabow, Garrett & Dunner, L.L.P.

(57) ABSTRACT

A manufacturing method of a printed wiring board. On a conductor plate 1, approximately conical conductor bumps 1*a*, 1*a*, . . . are formed, the conductor bumps 1*a*, 1*a*, . . . being caused to penetrate through a prepreg 5 to project tip ends of the conductor bumps 1*a*, 1*a*, . . . from an opposite side of the prepreg 5. The tip ends of the conductor bumps 1*a*, 1*a*, . . . and interconnection patterns 7*a* and 7*b* on surfaces of core material 17A, before bonding, are exposed to plasma to activate. The activated tip ends of the conductor bump 1*a*, 1*a*, . . . and interconnection patterns 7*a* and 7*b* on the surface of the core material are stacked to bond both.

8 Claims, 11 Drawing Sheets

U.S. PATENT DOCUMENTS

| | | | |
|---|---|---|---|
| 5,048,178 A | | 9/1991 | Bindra et al. ................ 29/830 |
| 5,220,723 A | * | 6/1993 | Okada ......................... 29/830 |
| 5,285,565 A | | 2/1994 | Ballard et al. ............... 29/609 |
| 5,384,952 A | | 1/1995 | Matsui ........................ 29/840 |
| 5,421,080 A | | 6/1995 | Bellavance et al. ........... 29/825 |
| 5,457,881 A | * | 10/1995 | Schmidt ..................... 29/852 |
| 5,600,103 A | | 2/1997 | Odaira et al. ............... 174/265 |
| 5,736,681 A | * | 4/1998 | Yamamoto et al. ......... 174/265 |
| 5,737,833 A | * | 4/1998 | Motomura et al. .......... 29/830 |
| 5,865,934 A | * | 2/1999 | Yamamoto et al. ......... 156/295 |
| 5,949,654 A | | 9/1999 | Fukuoka .................... 361/760 |
| 5,950,306 A | | 9/1999 | Suzuki et al. ................ 29/852 |
| 6,010,769 A | | 1/2000 | Sasaoka et al. ............. 428/209 |
| 6,159,842 A | * | 12/2000 | Chang et al. ................ 438/622 |
| 6,432,822 B1 | * | 8/2002 | Ngo et al. ................... 438/687 |
| 6,468,833 B2 | * | 10/2002 | Uner et al. .................. 438/115 |
| 2001/0019177 A1 | * | 9/2001 | Sugihara ..................... 257/780 |

FOREIGN PATENT DOCUMENTS

| | | |
|---|---|---|
| JP | 7-099397 | 4/1995 |
| JP | 7-170079 | 7/1995 |
| JP | 8-078912 | 3/1996 |
| JP | 8-162559 | 6/1996 |
| JP | 8-204334 | 8/1996 |
| JP | 8-250827 | 9/1996 |
| JP | 8-316686 | 11/1996 |
| JP | 9-023067 | 1/1997 |
| JP | 9-162553 | 6/1997 |
| JP | 9-172243 | 6/1997 |
| JP | 9-191177 | 7/1997 |

OTHER PUBLICATIONS

Osamu Shimada et al., U.S. Ser. No. 09/403,223, "Wiring Board, Wiring Board Fabrication Method and Semiconductor Package", filed Oct. 15, 1999.

Akira Ogawa et al., U.S. Ser. No. 09/355,438, "Method and Apparatus for Manufacturing Multi–Layered Wiring Board and Multi–Layered Wiring Board", filed Jul. 28, 1999.

* cited by examiner

PRINTED WIRING BOARD WITH PLURALITY OF INTERCONNECT PATTERNS AND CONDUCTOR BUMPS

BACKGROUND OF THE INVENTION

1. Field of the Invention

The present invention relates to a printed wiring board and a manufacturing method thereof, more specifically to a printed wiring board what is called a multi-layered substrate in which a plurality of interconnection patterns are disposed in multi-stages through a plurality of insulating substrates and between the respective interconnection patterns electrical communication is established and a manufacturing method thereof.

2. Description of the Related Art

As a manufacturing method of a multi-layered substrate, there is known a method in which a wedge type conductor bump is pressure-fitted in a thickness direction of a substrate to interconnect between layers thereof. FIG. 16 is a vertical sectional view of a substrate unit of an existing multi-layered substrate.

Figure 16A:
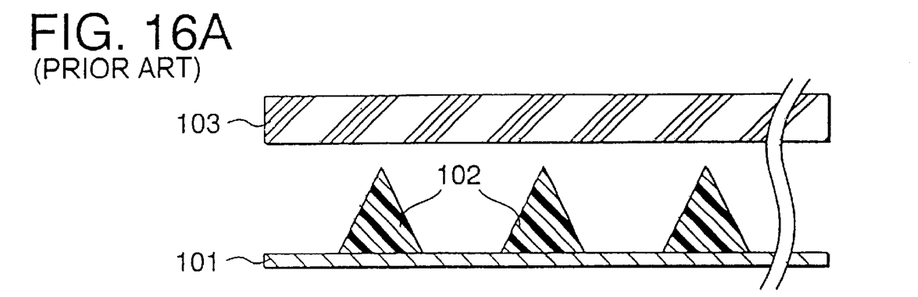
FIG. 16 is vertical sectional views showing steps for manufacturing an existing printed wiring board.

As shown in FIG. 16, in the existing method, on a copper foil 101 a plurality of conductor bumps 102, 102, . . . constituted of silver paste are formed by the use of printing technology or the like (FIG. 16A). On tip end sides thereof 102, 102, uncured insulating material, namely prepreg 103, is overlapped, followed by pressing to cause the conductor bumps 102, 102, . . . to penetrate through the prepreg 103 (FIG. 16B). Thereafter, one what is called core material 104 where on both surfaces of an insulating substrate, interconnection patterns are formed is stacked together with the above prepregs with the conductor bumps (FIG. 16C). The stacked body is pressed under heating so that the tip ends of the conductor bumps 102, 102, . . . are pressed against the interconnection patterns on surfaces of the core material 104 to bring into contact, thereby forming inter-layer connection (FIG. 16D).

In the above method, in a thickness direction of the prepreg 103, the conductor bumps 102, 102, . . . are pressure-fitted to penetrate through the prepreg. As a result, on the tip ends of the conductor bump 102, 102, . . . large pressing force is exerted. Accordingly, the conductor bumps 102, 102, . . . , so as to stand the pressing force, are necessary to be large in degree of thickness and magnitude to some extent.

SUMMARY OF THE INVENTION

Electronic equipment such as portable telephones and personal computers have been downsized year by year. As a result, a multi-layered substrate used therein is also demanded to downsize. Accordingly, integration degree of the multi-layered substrate is necessary to be improved furthermore. Resultantly, the conductor bump is also necessary to be miniaturized.

However, the miniaturization of the conductor bump causes lowering of mechanical strength against the pressing force. As a result, there are problems that the conductor bump, when press-fitting in the prepreg, is deformed to lower reliability of interlayer connection.

Furthermore, when a diameter of the conductor bump is made smaller, areas of tip end and lower surfaces become smaller. As a result, contact areas between the above surfaces and interconnection patterns decrease to result in lowering of reliability of interlayer connection.

Figure 16B:
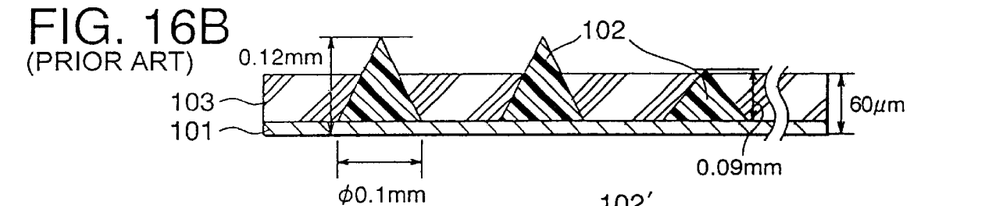
Figure 16C:
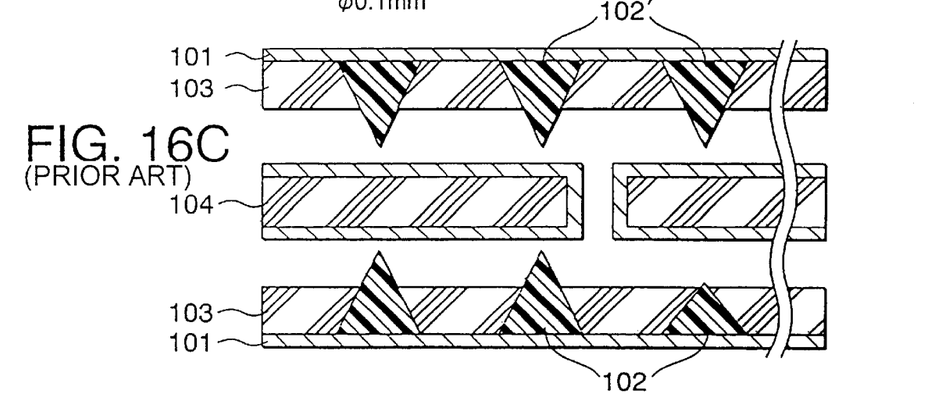
Figure 16D:
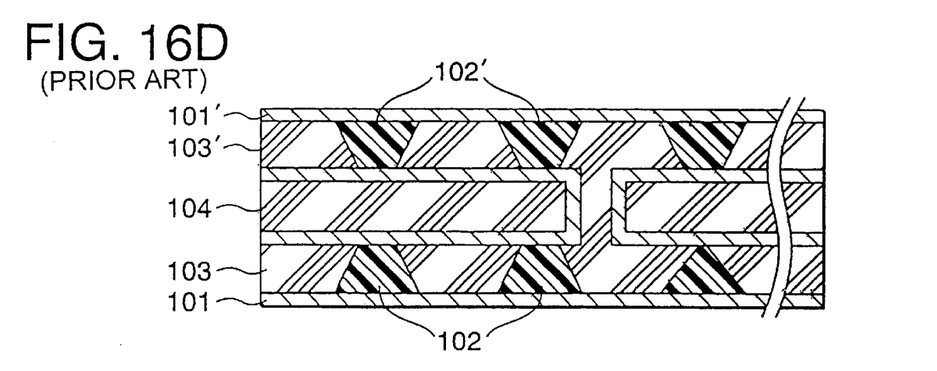

For instance, when forming a conductor bump of which lower surface diameter is 0.1 mm, as shown at the left end of FIG. 16B, a bump height of 0.12 mm is necessary. However, according to the existing printing technology, there is a limit in height accuracy of the conductor bump that can be formed, resulting in dispersion of the conductor bump height. When the height of the conductor bump is 0.9 mm as shown at the right end of FIG. 16B, resin in the prepreg 103 covers a head of the conductor bump. Accordingly, the conductor bump could not penetrate through the prepreg 103 of a thickness of 0.06 mm, resulting in inability to form the interlayer connection.

Furthermore, due to the strong pressing force exerting during press-fitting the conductor bump into the prepreg, strain is formed in the prepreg to affect adversely on the characteristics of the printed wiring board.

The present invention is made to overcome these existing problems. That is, an object of the present invention is to provide a printed wiring board of which reliability of the interlayer connection is high even after a conductor bump is miniaturized, and a manufacturing method of such printed wiring board.

DESCRIPTION OF EMBODIMENTS

A manufacturing method of a printed wiring board involving one aspect of the present invention comprises forming a conductor bump on a conductor plate, causing the conductor bump to penetrate through a prepreg of an insulating material substrate, plasma-treating the conductor bump and a surface of core material disposed facing to the conductor bump to activate, stacking the conductor plate and core material in an activating atmosphere to connect the conductor bump and an interconnection pattern on a surface of the core material, and pressurizing the stacked conductor plate and core material under heating to cure the prepreg.

Furthermore, another method for manufacturing a printed wiring board involving second aspect of the present invention comprises forming a conductor bump on a conductor plate, plasma-treating the conductor bump and a surface of core material disposed facing to the conductor bump to activate, and stacking the conductor plate and the core material in an activating atmosphere to bond the conductor bump and an interconnection pattern on a surface of the core material.

Furthermore, a printed wiring board involving third aspect of the present invention comprises a substrate made of insulating material, a first interconnection pattern disposed on a first surface of the substrate, a second interconnection pattern disposed on a second surface of the substrate, and a conductor bump that is embedded in the substrate, connects electrically the first and second interconnection patterns, and has a trapezoidal vertical section. Here, the conductor bump has a lower surface diameter, an upper surface diameter and a height of from 55 to 65 $\mu$m, from 30 to 35 $\mu$m and from 55 to 65 $\mu$m, respectively.

Embodiment 1

In the following, a manufacturing method involving a first embodiment of the present invention will be explained.

Figure 1:
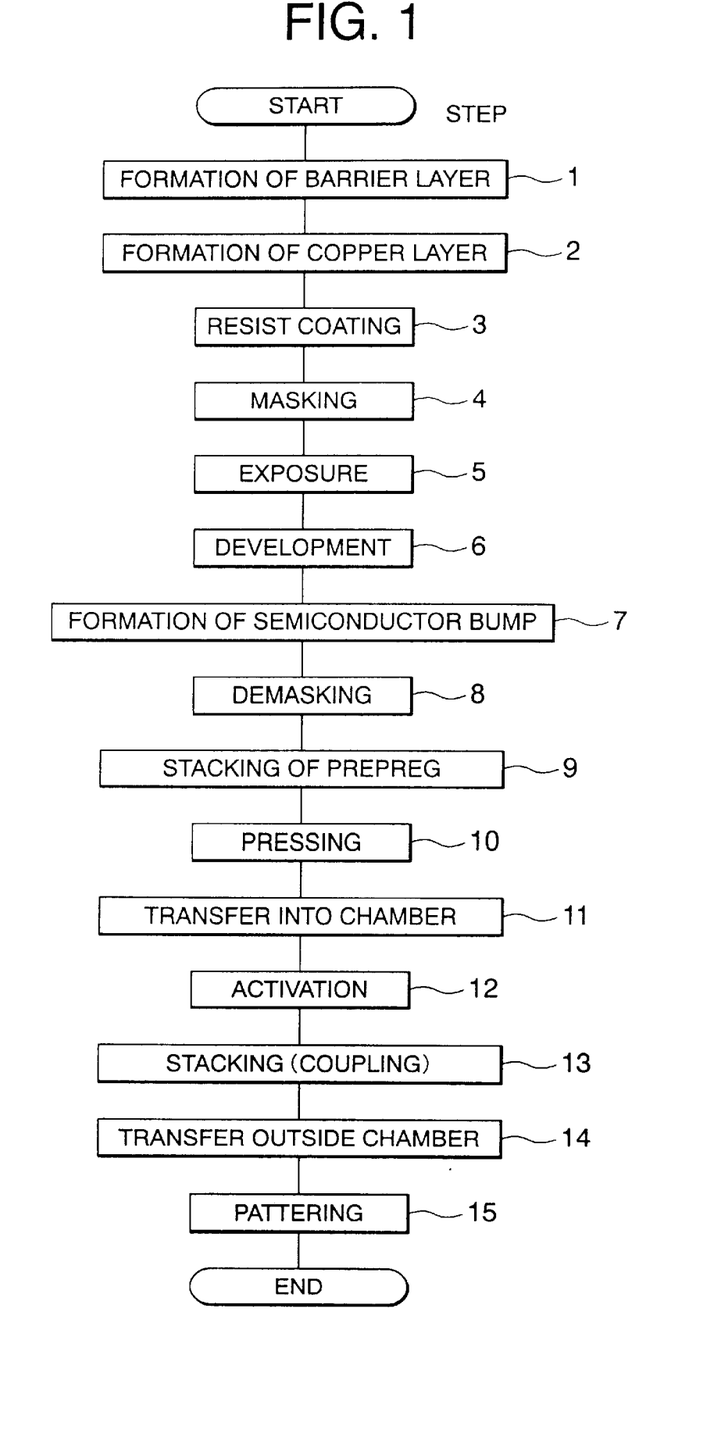
FIG. 1 is a flow chart illustrating a flow of a manufacturing method of a printed wiring board according to one embodiment of the present invention.

FIG. 1 is a flow chart illustrating a flow of a manufacturing method of a printed wiring board involving the present embodiment, FIGS. 2 through 7 being vertical sectional views showing schematically the respective steps by which a printed wiring board involving the present embodiment is manufactured.

Figure 2A:
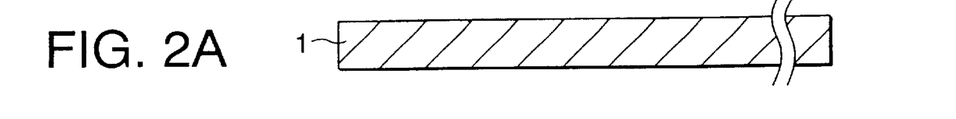
FIG. 2 is vertical sectional views showing steps through which a printed wiring board involving one embodiment of the present invention is made.

For manufacturing a printed wiring board involving the present embodiment, first, a conductor plate 1 such as a thin copper plate or the like as shown in FIG. 2A is prepared. For the conductor plate 1, one of a thickness from 30 to 60 $\mu$m is preferably used. The reason for limiting a preferable thickness of the conductor plate 1 to the aforementioned range is as follows. When forming a bump by means of the etching, the size thereof is necessary to have an aspect ratio, a ratio of a lower surface diameter to a height, of approximate 1. When the thickness of the conductor plate 1 exceeds the upper limit of the above range, a minute bump of the lower surface diameter $\phi$ of 60 $\mu$m becomes difficult to form. On the contrary, when the thickness of the conductor plate 1 is smaller than the lower limit of the above range, similarly from the restriction of the aspect ratio, both lower surface diameter and height of the conductor bump become smaller. As a result, the bump penetrates through the resin in the prepreg with difficulty. In other words, the larger the height of the bump is in comparison with a thickness of the prepreg resin, the easier penetrates the bump.

Figure 2B:
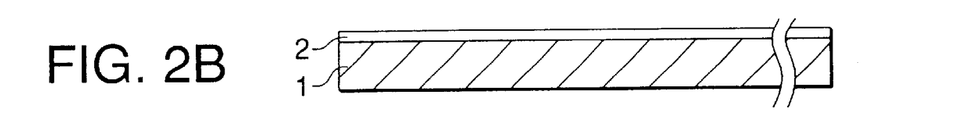

On one surface of the conductor plate 1, a barrier metal layer 2 as shown in FIG. 2B is formed (step 1). The barrier metal layer 2 functions as a breakwater to prevent a lower side than the conductor plate 1 from being etched during the etching step described below, being formed by sputtering or plating a layer consisting of for instance nickel and so on.

Figure 2C:
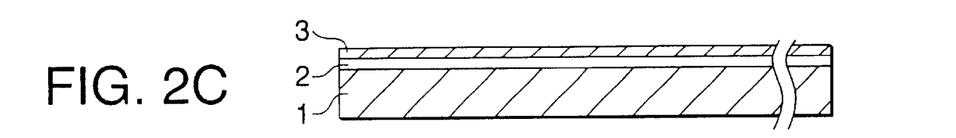

Next, as shown in FIG. 2C, on the barrier metal layer 2, a copper layer 3 that is material of an interconnection pattern is formed by means of for instance sputtering or plating (step 2).

Figure 2D:
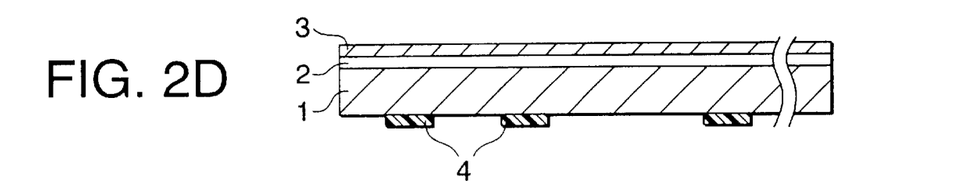

Then, as shown in FIG. 2D, the masking 4, 4, . . . is implemented on the surface of the conductor plate 1. The masking 4, 4, . . . is formed in circle on portions of the conductor plate 1 where the conductor bumps are wanted to be formed. The masking is formed in the following way, for instance. Resist consisting of photosensitive resin is coated (step 3), thereon a mask pattern corresponding to the interconnection pattern being overlapped (step 4), through the mask pattern (omitted from showing in the figure) the resist being exposed to make insoluble the portion to be remained (step 5). Thereafter, development for removing an unnecessary portion with a solvent or the like is followed (step 6).

Figure 2E:
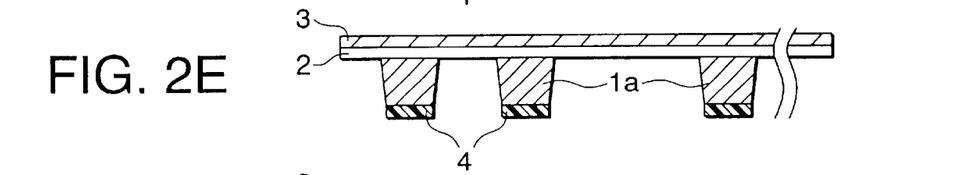

On the conductor plate 1 on prescribed portions of which the masking 4, 4, . . . is formed, a prescribed treatment is implemented to form conductor bumps 1$a$, 1$a$, . . . (step 7). The conductor bumps 1$a$, 1$a$, . . . are manufactured in the following ways. The conductor plate 1 in a state as shown for instance in FIG. 2D is immersed in an etching solution. Alternatively, by means of a dry etching method, portions where the masking 4, 4, . . . is not formed of the conductor plate 1 shown in FIG. 2D are cut to form the conductor bumps 1$a$, 1$a$, . . . trapezoidal in vertical section as shown in FIG. 2E.

The conductor bump is preferable to have a lower surface diameter from 55 to 65 $\mu$m, an upper surface diameter from 30 to 35 $\mu$m and a height from 55 to 65 $\mu$m.

The reason for setting the preferable lower surface diameter of the conductor bump in the aforementioned range is as follows. When the lower surface diameter is smaller than the lower limit of the above range, in forming the bump by means of the etching, the resist becomes weak in sticking property to copper to peel off with ease. On the contrary, when the lower surface diameter is above the upper limit of the above range, the bump of larger diameter is formed. As a result, the bump, when penetrating through the prepreg resin, tends to meet resistance due to pressing pressure, resulting in difficulty in the penetration of the bump.

Furthermore, the reason the preferable upper surface diameter of the conductor bump is set at sizes in the aforementioned range is as follows. When the upper surface diameter is under the lower limit of the above range, an area coming into contact with the copper pattern becomes smaller to lower an intimate contact force, resulting in a decrease of reliability of electrical connection. On the contrary, when the upper surface diameter is larger than the upper limit of the above range, a sectional shape of the conductor bump deviates from a trapezoidal shape. Accordingly, the conductor bump can penetrate through the prepreg resin with difficulty.

Furthermore, the reason the preferable height of the conductor bump is set at sizes in the aforementioned range is as follows. When the height thereof is under the lower limit of the above range, the thickness of the prepreg to be used becomes further smaller to result in deteriorating insulating properties between above and below conductor layers. On the contrary, when the height is larger than the upper limit of the above range, the conductor bump is caused to penetrate through the resin with difficulty.

Figure 2F:
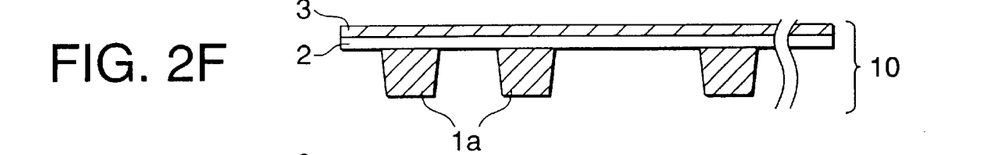

When the formation of the conductor bump by means of etching or the like is brought to completion, the masking 4, 4, . . . at the tip end surfaces of the conductor bumps 1a, 1a, . . . is removed (step 8). Thereby, a metal plate 10 where on two layers of metals 3 and 2 as shown in FIG. 2F the conductor bumps 1a, 1a, . . . are formed is formed.

Figure 2G:
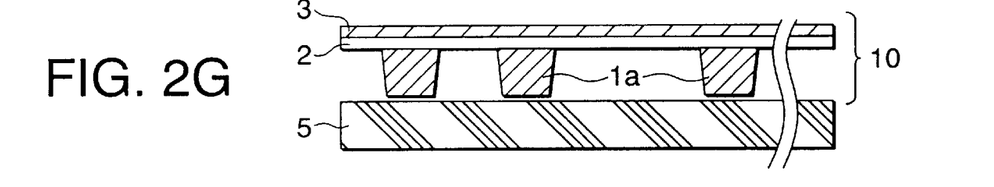

Next, as shown in FIG. 2G, on the side of the conductor bumps 1a, 1a, . . . formed on one surface of the metal plate 10, a prepreg of an insulating substrate (hereafter simply refers to as prepreg) 5 is stacked (step 9). The prepreg is formed by impregnating insulating resin such as epoxy resin or the like in reinforcing material such as glass fiber or the like, followed by forming in a thin plate.

Figure 2H:
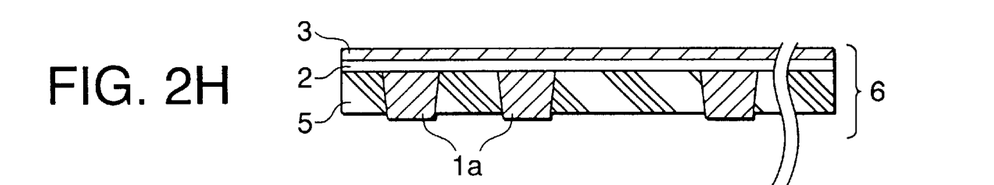

By pressing in this state (step 10), the conductor bumps 1a, 1a, . . . are caused to penetrate through the prepreg 5 to project, as shown in FIG. 2H, the tip ends thereof 1a, 1a, . . . from an opposite surface (lower surface in the figure) of the prepreg 5.

At that time, it is preferable for the tip ends of the conductor bumps 1a, 1a, . . . to protrude from 1 to 5 µm from the surface of the prepreg 5.

The reason the preferable range of the length by which the tip ends of the conductor bumps 1a, 1a, . . . project from the surface of the prepreg 5 is set in the above range is as follows. When the projected length is smaller than the lower limit of the above range, in the plasma treatment that is implemented by glow discharging in an inert gas of extremely low pressure from $133.3 \times 10^{-1}$ to $133.3 \times 10^{-4}$ Pa, plasma particles do not collide with the conductor bump 1a.

On the contrary, when being larger than the upper limit of the above range, a distance between the above and below conductor layers becomes larger due to the height of the conductor bump. Accordingly, when flowing (fusing) the prepreg to cure, the gap between the above and below conductor layers cannot be completely filled.

By causing to project, as shown in FIG. 2H, the tip ends of the conductor bumps 1a, 1a, . . . by a prescribed length from the surface of the prepreg 5, activation described below can be implemented with ease. Furthermore, since the tip ends come into contact with core material described below with ease, in connecting between the layers, there is an effect that an electrical bonding is assuredly implemented.

Thus, a printed wiring board unit 6 is obtained.

Figure 3:
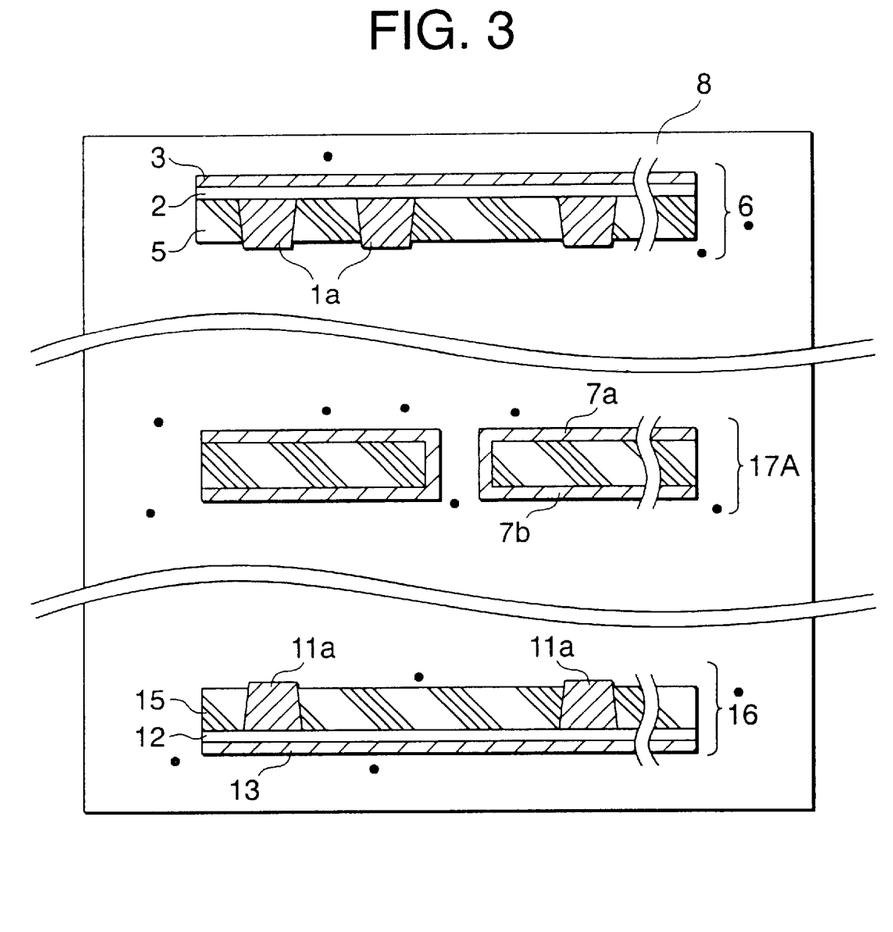
FIG. 3 is vertical sectional views showing steps through which a printed wiring board involving one embodiment of the present invention is made.

On the other hand, as shown in FIG. 3, similarly as the above, another printed wiring board unit 16 is formed.

Furthermore, on both surfaces of an insulating material plate 7, conductor plates of copper foil or the like are stuck to prepare core material 17. The conductor plates on both surfaces of the core material are patterned by means of the etching or the like to form interconnection patterns 7a and 7b. Thus, core material 17A is prepared.

Then, these three of printed wiring board units 6 and 16 and the core material 17A are accommodated in a chamber 8 to plasma treat to activate (step 11).

The chamber 8 is a box type device capable of closely sealing. By means of a vacuum system, a treatment gas supplier, and electrodes and a power supply system for applying a voltage to the electrodes, all of which are omitted showing in the figure, plasma is generated in the chamber 8.

After transferring the printed wiring board units 6 and 16 and the core material 17A in the chamber 8, the chamber is tightly closed, while supplying a treatment gas under a vacuum, a voltage being applied to generate the plasma.

Upon generating the plasma in the chamber 8 in this state, the generated plasma, as shown in FIG. 3, collides with the respective surfaces of the interconnection patterns 7a and 7b and the conductor bumps 1a, 1a, . . . and 1a, 1a, . . . on the respective surfaces of the printed wiring board units 6 and 16 and the core material 17A, thereby activating the surfaces of the interconnection patterns 7a and 7b and the conductor bumps 1a, 1a, and 1a, 1a, . . . (step 12).

Figure 4:
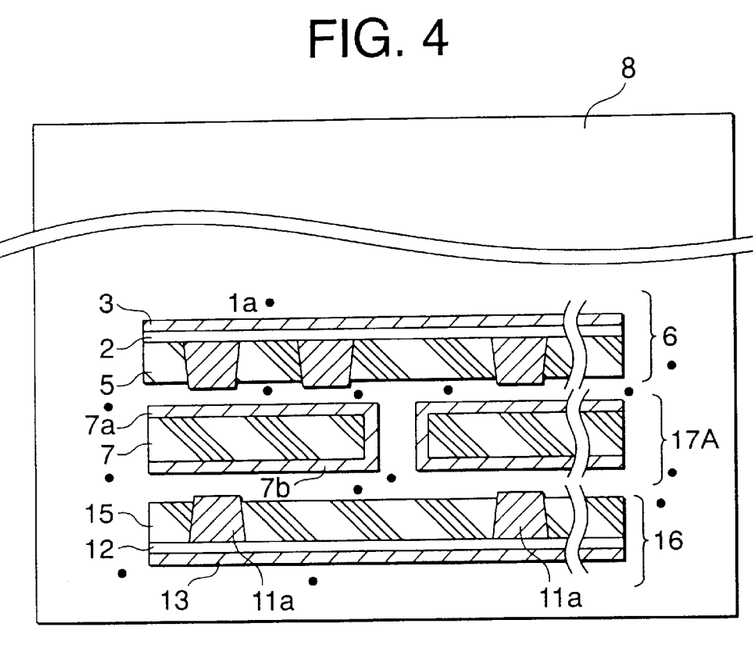
FIG. 4 is a vertical sectional view showing a step through which a printed wiring board involving one embodiment of the present invention is made.

Next, the printed wiring board units 6 and 16 and the core material 17A surfaces of metal portions of which are activated as mentioned above are stacked in the following ways. That is, as shown in FIG. 4, with the core material 17A disposed in the center and with the conductor bumps 1a, 1a, . . . and 11a, 11a, . . . disposed to direct inwardly from both sides thereof, these are overlapped to stack (step 13).

Figure 5:
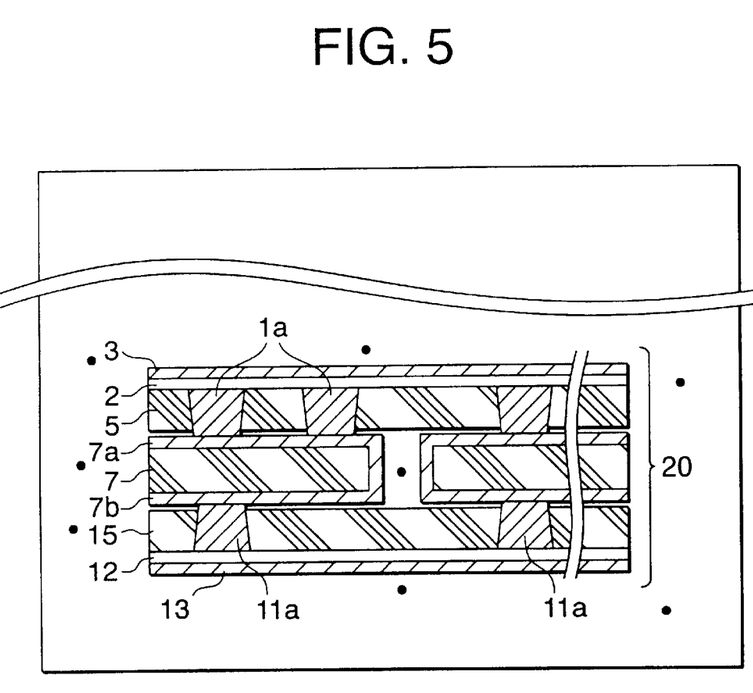
FIG. 5 is a vertical sectional view showing a step through which a printed wiring board involving one embodiment of the present invention is made.

At that time, both surfaces of opposing conductor bumps 1a, 1a, . . . and 1a, 1a, . . . and interconnection patterns 7a and 7b on the surface of the core material 17A have been activated by the plasma. Accordingly, there is no need of pressing with a large pressing force. Only over lapping the printed wiring board units 6 and 16 and the core material 17A is enough to bond the interconnection patterns 7a and 7b and the conductor bumps 1a, 1a, . . . and 1a, 1a, . . . as shown in FIG. 5 to form electrical contact.

When the bonding between the conductor bumps 1a, 1a, and 1a, 1a, . . . and the interconnection patterns 7a and 7b by means of the stacking of the printed wiring board units is brought to completion, the stacked printed wiring board 20 is transferred out of the chamber 8 (step 14).

Figure 6:
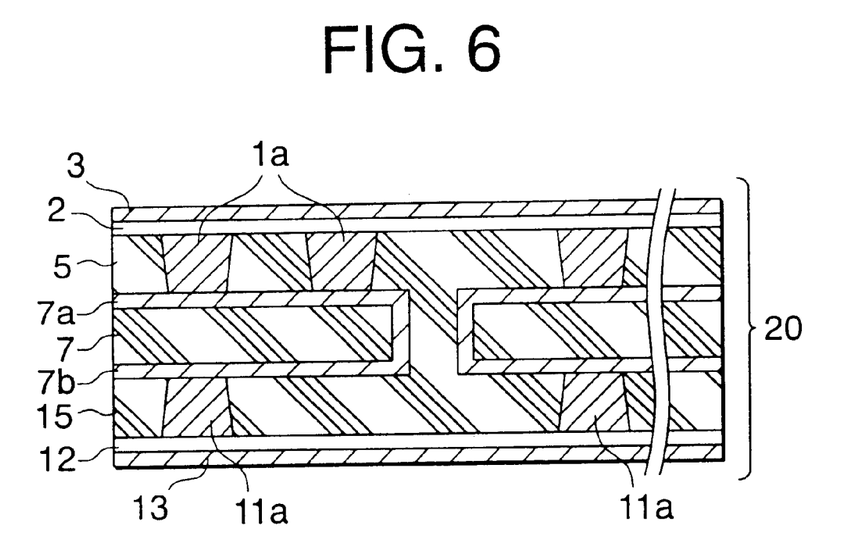
FIG. 6 is a vertical sectional view showing a step through which a printed wiring board involving one embodiment of the present invention is made.

In the printed wiring board 20 thus taken out of the chamber 8, as shown in FIG. 6, each of both surfaces thereof 20 is covered by a sheet of copper layer 3, 13.

Next, these copper layers 3 and 13 are patterned to form interconnection patterns 3a and 13a (step 15). As the patterning method at that time, a method is cited in which after resist consisting of for instance photosensitive resist is coated, a prescribed mask pattern is overlapped to expose, followed by developing, thereafter, unnecessary resist being removed. For instance, by increasing a concentration of the etching solution and elongating a time for showering base material, both copper and nickel are etched.

Figure 7:
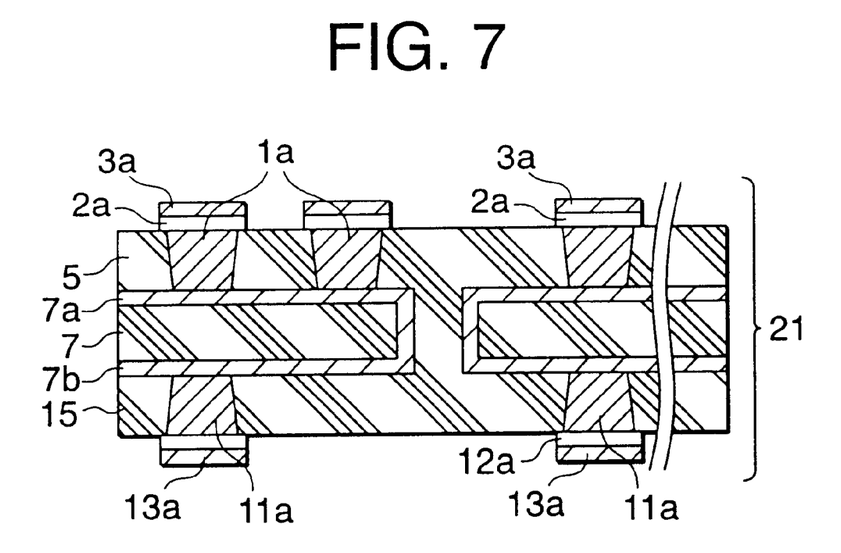
FIG. 7 is a vertical sectional view showing a step through which a printed wiring board involving one embodiment of the present invention is made.

FIG. 7 is a vertical sectional view of a printed wiring board 21 of which patterning has been brought to completion.

As explained above, in the manufacturing method of the printed wiring board involving the present embodiment, the plasma is collided to activate the surfaces. Thus activated conductor bumps and interconnection patterns are stacked to bond, thereby forming interlayer connection. Accordingly, the bonding strength between the conductor bumps and the interconnection patterns is heightened to largely improve reliability of interlayer connection.

Furthermore, as a result of the improvement of connection reliability between the conductor bumps and the interconnection patterns, the conductor bumps can be made smaller. For instance, even when the interlayer connection is implemented with a minute bump of which lower and upper surface diameters are approximately 0.1 mm and 0.05 mm respectively, the interlayer connection high in the connection reliability can be formed. Thereby, the printed wiring board of high integration degree can be obtained.

Furthermore, by colliding the plasma onto the surfaces of the interconnection patterns and the conductor bumps, an oxide film on the surfaces thereof can be removed, resulting in the more assured formation of the interlayer connection.

In addition, after forming the barrier metal layer on the conductor plate and the copper layer on the barrier metal layer, the conductor plate is etched to form the conductor bump. Thereby, the conductor bumps can be formed with high yield.

Furthermore, by activating the surface by means of the plasma, the interlayer connection due to a minute conductor bump is facilitated to result in an improvement of an integration degree.

In the following, more specific Embodiment of the aforementioned Implementation Mode of the present invention will be explained.

On a copper foil 1 of a thickness 60 μm as shown in FIG. 2A, nickel layer 2 and copper layer 3 are plated to form a laminate as shown in FIG. 2C. The copper foil 1 of the laminate is selectively etched to form conductor bumps 1a, 1a, . . . on the nickel and copper layers 2 and 3.

Next, on the conductor bumps 1a, 1a, . . . on the nickel and copper layers 2 and 3, a sheet of synthetic resin 5 is stacked and pressurized under heating that the conductor bumps 1a, 1a, are made to penetrate through the synthetic resin sheet 5, as shown in FIG. 2H.

At that time, the synthetic resin sheet 5 is one in a B-stage condition, that is, non-cured one. Next, the synthetic resin sheet 5 (laminate 6) therethrough the conductor bumps 1a, 1a, penetrate and a double-sided substrate 7 are transferred in the chamber 8 as shown in FIG. 3. Then, the inside of the chamber 8 is filled with an inert gas of extreme low pressure from $133.3 \times 10^{-1}$ to $133.3 \times 10^{-4}$ Pa, and the tip ends of the conductor bumps 1a, 1a, . . . of the laminate 6 and surface of the copper foil of the double-sided substrate 7 are exposed in the plasma to activate the metal surfaces.

Next, as shown in FIG. 5, the surfaces of the penetrated conductor bumps 1a, 1a, . . . and the copper foils of the double-sided substrate 7 are brought into contact to stack in a vacuum from $133.3 \times 10^{-4}$ to $133.3 \times 10^{-6}$ Pa, thereby causing to form metallic bond between the conductor bumps 1a, 1a, . . . and the copper foils of the double-sided substrate 7.

Next, the laminate 6 and the double-sided substrate 7 are pressurized under heating to melt the synthetic resin sheet 5, followed by curing to prepare a four-layered copper-clad substrate as shown in FIG. 5. When employing FR-4 (registered trade mark) of Risho Kogyo Kabushiki Kaisha as the synthetic resin, while heating at temperatures of 125° C. and 175° C. for 20 and 60 min respectively, it is pressurized under a pressure from 40 to 600 kg/cm². Thereafter, the metallic layer (nickel+copper) on a surface layer of the four-layered copper-clad substrate of FIG. 6 is selectively etched to obtain a four-layered printed wiring board 21 as shown in FIG. 7.

Upon checking electrical characteristics of the printed wiring board 21, it is confirmed that electrical resistance in a thickness direction of the substrate is as low as from 0.001 to 0.003 Ω and excellent interlayer connection is formed.

Embodiment 2

In a manufacturing method of a printed wiring board involving the present embodiment, after implementing interlayer connection between a plurality of conductor plates by means of conductor bumps, in gaps between the conductor plates insulating material is filled.

Figure 8:
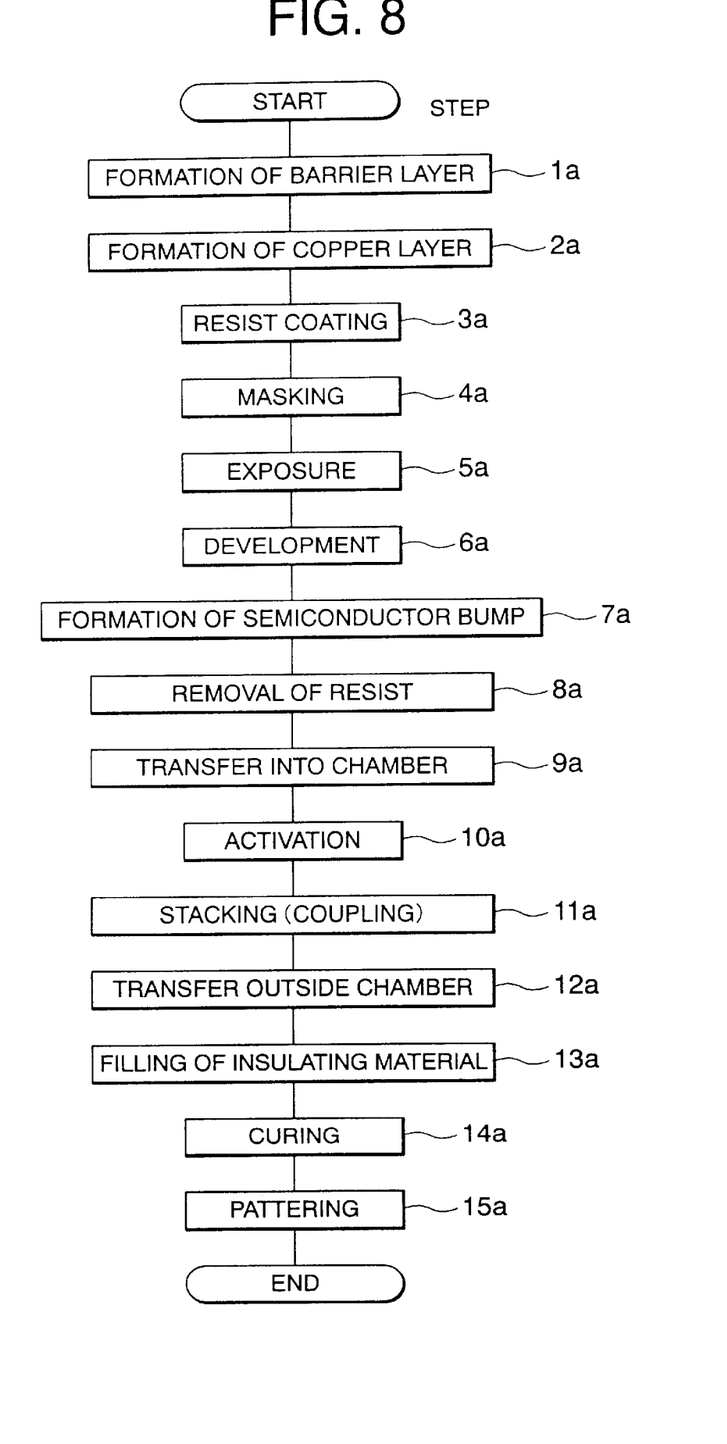
FIG. 8 is a flow chart illustrating a flow of a manufacturing method of a printed wiring board involving a second embodiment of the present invention.

FIG. 8 is a flow chart illustrating a flow of a manufacturing method of a printed wiring board involving the present embodiment, FIGS. 9 through 15 being vertical sectional views showing schematically each steps by which a printed wiring board involving the present embodiment is manufactured.

Figure 9A:
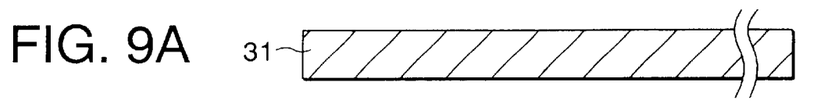
FIG. 9 is vertical sectional views showing steps through which a printed wiring board involving a second embodiment of the present invention is made.
Figure 9B:
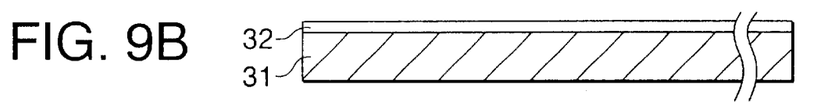

In order to manufacture a printed wiring board involving the present embodiment, a conductor plate 31 such as a thin copper plate as shown in FIG. 9A is prepared, and on one surface of the copper plate 31, a barrier metal layer 32 as shown in FIG. 9B is formed of for instance nickel (step 1a).

Figure 9C:
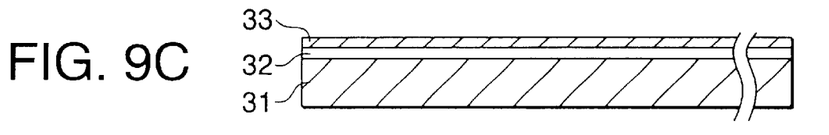

Then, as shown in FIG. 9C, on the barrier metal layer 32 a copper layer 33 therefrom an interconnection pattern is formed is formed by means of for instance sputtering or plating (steps 2a through 6a).

Figure 9D:
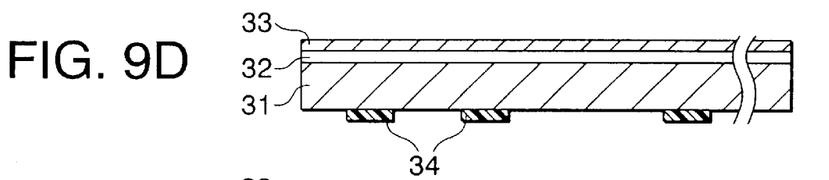

Then, as shown in FIG. 9D, masking 34, 34, . . . is formed on the surface of the conductor plate 1.

Figure 9E:
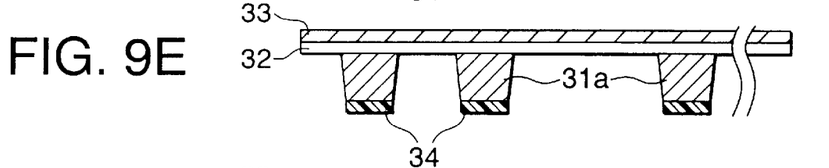

On the conductor plate 1 on prescribed portions thereof the masking 34, 34, . . . is formed, a prescribed treatment, for instance wet etching is implemented to form conductor bumps 31a, 31a, . . . are formed (step 7a).

Figure 9F:
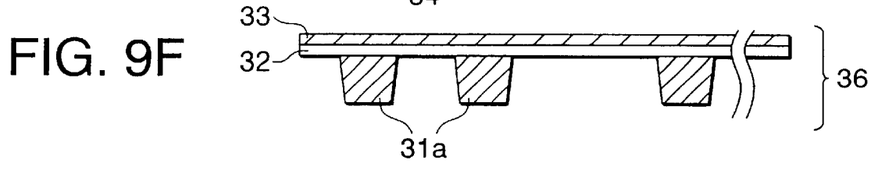

After the formation of the conductor bumps being brought to completion, the masking 34, 34, . . . on tip end surfaces of the conductor bumps 31a, 31a, . . . is removed (step 8a). Thereby, a metal plate 40 in which the conductor bumps 31a, 31a, . . . are formed on two layers of metals 33 and 32 is formed. By the way as shown above, a printed wiring board unit 36 is obtained.

Figure 10:
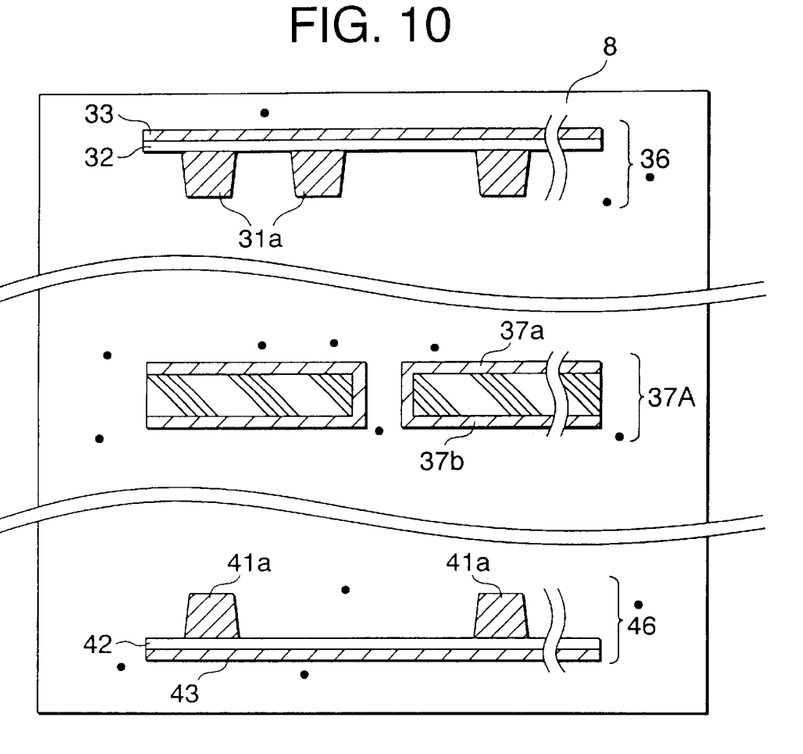
FIG. 10 is vertical sectional views showing steps through which a printed wiring board involving a second embodiment of the present invention is made.

On the other hand, as shown in FIG. 10, similarly as the above, another printed wiring board 46 is formed.

Furthermore, conductor plates such as copper plate or the like are stuck on both surfaces of a plate of insulating material, the conductor plates on both surfaces thereof being patterned by means of the etching or the like to form interconnection patterns 37a and 37b. Thereby, core material 37A is prepared.

These three sheets of printed wiring boards 36 and 46 and the core material 37A are accommodated in the chamber 8 to activate by means of the plasma treatment (step 9a).

The printed wiring boards 36 and 46 and the core material 37A are transferred in the chamber 8. Thereafter, the chamber 8 is tightly closed and while supplying a treatment gas under a vacuum, a voltage is applied to generate plasma.

Upon generating the plasma in the chamber 8 in this state, the generated plasma, as shown in FIG. 10, collides with the respective surfaces of the interconnection patterns and conductor bumps on the respective surfaces of the printed wiring board units 36 and 46 and the core material 37A. Thereby, the surfaces of the interconnection patterns and conductor bumps are activated (step 10a).

Figure 11:
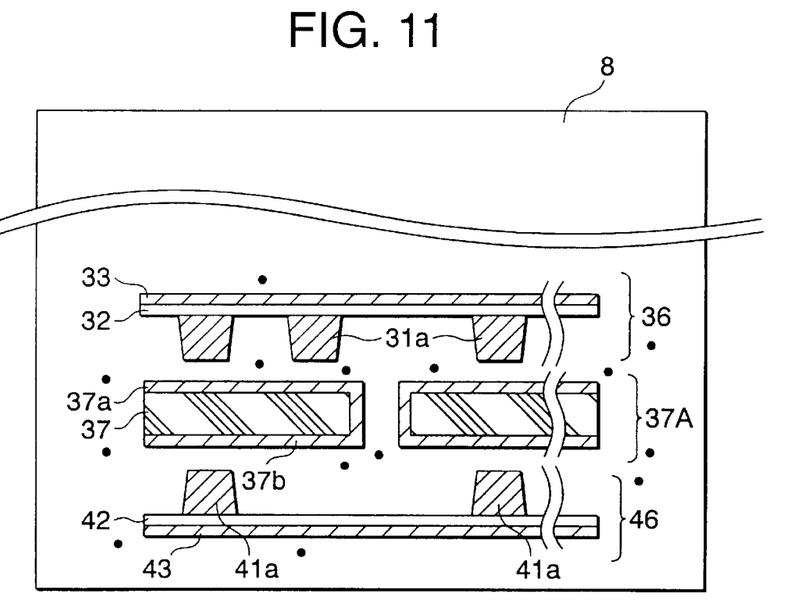
FIG. 11 is a vertical sectional view showing a step through which a printed wiring board involving a second embodiment of the present invention is made.

Next, the printed wiring board units 36 and 46 and the core material 37A surfaces of metal portions of which are activated as mentioned above are stacked in the following ways. That is, as shown in FIG. 11, with the core material 37A disposed in the center and with the printed wiring board units 36 and 46 disposed so that the conductor bumps are directed inwardly from both sides, these are overlapped to stack (step 11a).

Figure 12:
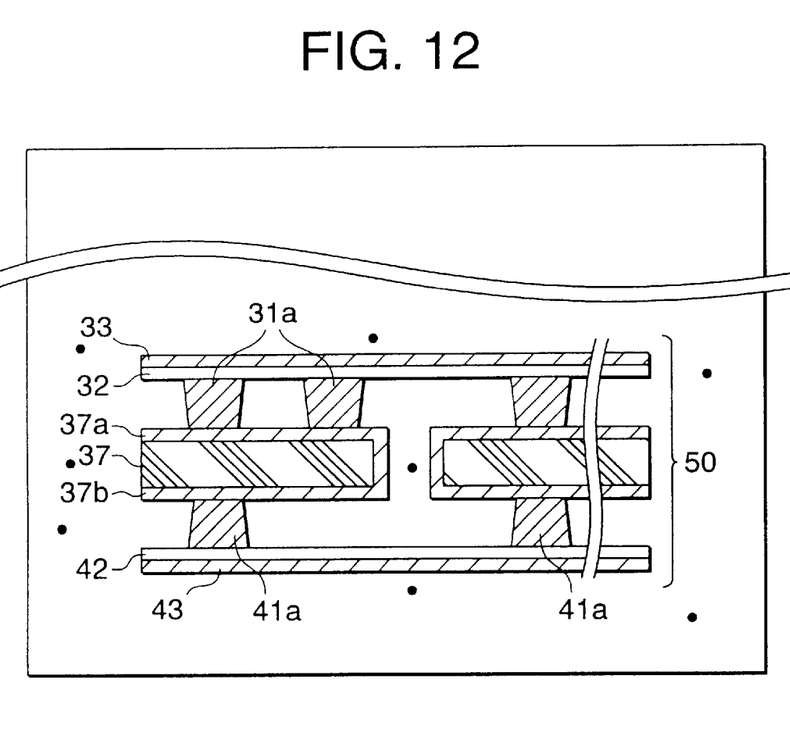
FIG. 12 is a vertical sectional view showing a step through which a printed wiring board involving a second embodiment of the present invention is made.

At that time, the surfaces of both facing conductor bumps and interconnection patterns on the surface of the core material 37A are activated by means of the plasma. Accordingly, there is no need of pressurizing under a large pressing force, but only overlapping the printed wiring board units 36 and 46 and the core material 37A is enough to bond the interconnection patterns and the bumps as shown in FIG. 12 to establish electrical communication.

When the bonding between the conductor bumps and the interconnection patterns by means of stacking of the printed wiring board units is brought to completion, a stacked printed wiring board 50 is transferred out of the chamber 8 (step 12a).

Figure 13:
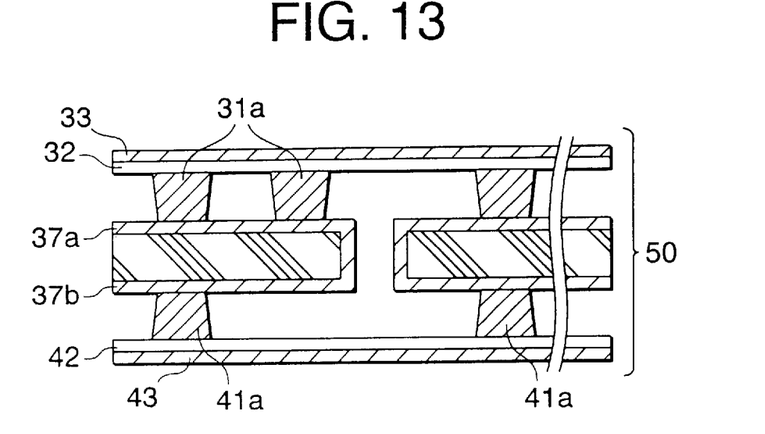
FIG. 13 is a vertical sectional view showing a step through which a printed wiring board involving a second embodiment of the present invention is made.

In the printed wiring board 50 taken out of the chamber 8, as shown in FIG. 13, the interconnection patterns on the surface of the core material 37A and the conductor plates are bonded through the conductor bumps 31a and 41a and there are formed gaps between the respective conductor plates and the core material 37A.

Figure 14:
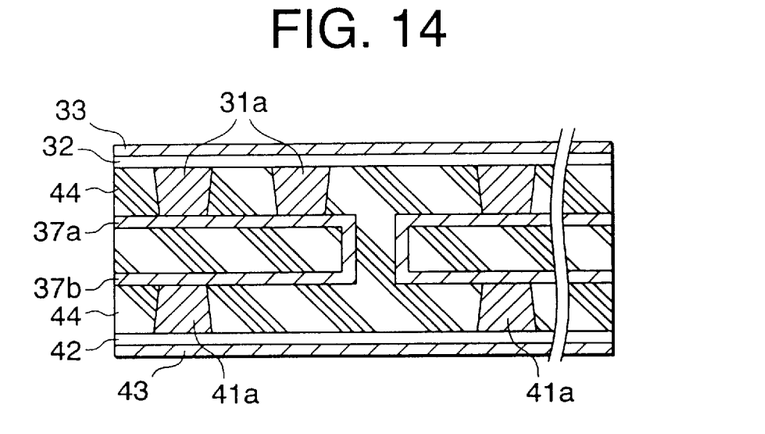
FIG. 14 is a vertical sectional view showing a step through which a printed wiring board involving a second embodiment of the present invention is made.

Next, to thus obtained laminate 50, in the gaps between the respective conductor plates and the core material 37A, insulating material 44 such as epoxy resin or the like is filled (step 13a).

As the filling method at that time, for instance a method can be cited in which the aforementioned laminate 50 is accommodated in the chamber 8, thereafter in the gaps between the respective conductor plates and the core material insulating material such as epoxy resin or the like is supplied.

When the filling of the insulating material is brought to completion, the laminate 50 is heated to cure the filled resin (step 14a).

Figure 15:
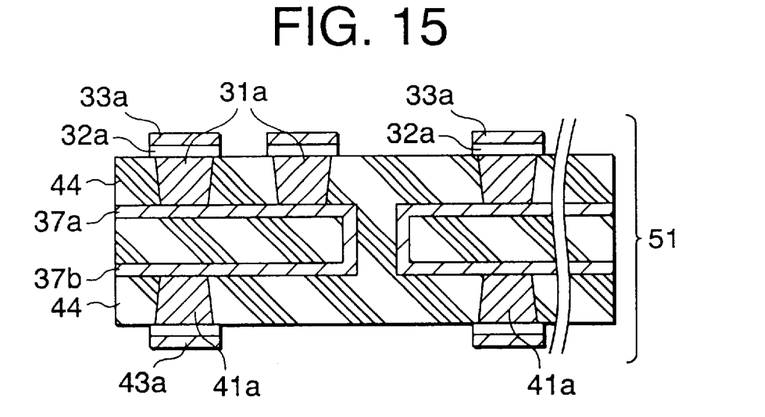
FIG. 15 is a vertical sectional view showing a step through which a printed wiring board involving a second embodiment of the present invention is made.

Next, the copper layers 33 and 43 are patterned to form interconnection patterns 33a, 33a, ... and 43a, 43a, ... (step 15a). Thereby, a multi-layered substrate 51 is obtained.

As explained above, in the manufacturing method of the printed wiring board involving the present embodiment, the conductor bumps and the interconnection patterns are activated to bond, thereafter the insulating material being filled in the gaps between the conductor bumps and the interconnection patterns. Accordingly, the conductor bumps and the interconnection patterns are strengthened in their sticking strength to result in a remarkable improvement of reliability of the interlayer connection.

Furthermore, there is no need of pressurizing the insulating substrate when implementing the interlayer connection. Accordingly, stress is not exerted on the substrate or does not remain in the substrate.

According to one aspect of the present invention, the conductor bumps and the interconnection patterns, after plasma-treatment to activate their surfaces, are bonded. Accordingly, even with further miniaturized conductor bumps, the interlayer connection of high connection reliability can be formed.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A method for manufacturing a printed wiring board, comprising:

forming a conductor bump on a conductor plate;

causing the conductor bump to penetrate through a prepreg of insulating material substrate;

plasma-treating a surface of the conductor bump and a surface of a core material having an interconnection pattern disposed facing to the conductor bump to activate the surface of the conductor bump and the surface of the core material;

stacking the conductor plate and the core material each having the activated surface so that the conductor bump and the core material are bonded together at a room temperature, to bond the surface of the conductor bump and the interconnection pattern on the surface of the core material; and pressurizing the stacked conductor plate and core material under heating to cure resin of the prepreg.

2. The method for manufacturing a printed wiring board as set forth in claim 1:

wherein forming the conductor bump on the conductor plate, comprising:
  forming a barrier metal layer on the conductor plate;
  implementing plating on the conductor plate to form a copper layer;
  implementing masking on the conductor plate; and
  etching the conductor plate through the masking to form an approximately conical conductor bump.

3. The method for manufacturing a printed wiring board as set forth in claim 1:

wherein the plasma-treating to activate is exposing the surface of the conductor bump and the surface of the core material to a plasma obtained by glow discharging in an inert gas atmosphere of extremely low pressure from $133.3 \times 10^{-4}$ to $5.332$ Pa (from 0.0001 to 0.04 Torr), to activate the surface of the conductor bump and the surface of the core material.

4. The method for manufacturing a printed wiring board as set forth in claim 1:

wherein stacking the conductor bump and the core material is performed in an atmosphere under a pressure from $133.3 \times 10^{-6}$ to $133.3 \times 10^{-4}$ Pa.

5. The method for manufacturing a printed wiring board as set forth in claim 1:

wherein causing the conductor bump to penetrate through the prepreg of insulating material substrate is one where from a surface of the prepreg of insulating material substrate a tip end of the conductor bump is projected by from 1 to 5 μm.

6. The method for manufacturing a printed wiring board as set forth in claim 1:

wherein the conductor bump is a metal bump.

7. A method for manufacturing a printed wiring board, comprising:

forming a conductor bump on a conductor plate;

plasma-treating a surface of the conductor bump and a surface of a core material having an interconnection pattern disposed facing to the conductor bump to activate the surface of the conductor bump and the surface of the core material; and stacking the conductor plate and the core material each having the activated surface so that the conductor bump and the core material are bonded together at a room temperature, to bond the surface of the conductor bump and the interconnection pattern on the surface of the core material.

8. The method for manufacturing a printed wiring board as set forth in claim 7, further comprising:

after stacking to bond the conductor bump and the interconnection pattern on the surface of the core material, filling insulating resin in a gap between the conductor plate and the core material; and pressurizing the stacked conductor plate and core material under heating to cure the filled insulating resin.

* * * * *

UNITED STATES PATENT AND TRADEMARK OFFICE
CERTIFICATE OF CORRECTION

PATENT NO.   : 6,705,003 B2
DATED        : March 16, 2004
INVENTOR(S)  : Motomura et al.

It is certified that error appears in the above-identified patent and that said Letters Patent is hereby corrected as shown below:

<u>Title page,</u>
Item [54], delete the title in its entirety and insert therefor -- METHOD OF MANUFACTURING PRINTED WIRING BOARD --.

Signed and Sealed this

Sixth Day of July, 2004

JON W. DUDAS
*Acting Director of the United States Patent and Trademark Office*